United States Patent
Kim et al.

(10) Patent No.: US 10,001,700 B2
(45) Date of Patent: Jun. 19, 2018

(54) PELLICLE FILM INCLUDING GRAPHITE-CONTAINING THIN FILM FOR EXTREME ULTRAVIOLET LITHOGRAPHY

(71) Applicants: Samsung Electronics Co., Ltd., Suwon-si, Gyeonggi-do (KR); Research & Business Foundation SUNGKYUNKWAN UNIVERSITY, Suwon-si, Gyeonggi-do (KR); Fine Semitech Co., Ltd., Hwaseong-si, Gyeonggi-do (KR)

(72) Inventors: Mun Ja Kim, Suwon-si (KR); Ji-beom Yoo, Seoul (KR); Seul-gi Kim, Suwon-si (KR); Sang-jin Cho, Osan-si (KR); Myung-shik Chang, Seongnam-si (KR); Jang-dong You, Osan-si (KR)

(73) Assignees: Samsung Electronics Co., Ltd., Gyeonggi-do (KR); Research & Business Foundation Sungkyunkwan University, Gyeonggi-do (KR); Fine Semitech Co., Ltd., Gyeonggi-do (KR)

(*) Notice: Subject to any disclaimer, the term of this patent is extended or adjusted under 35 U.S.C. 154(b) by 0 days. days.

(21) Appl. No.: 15/034,014

(22) PCT Filed: Jun. 3, 2014

(86) PCT No.: PCT/KR2014/004941
§ 371 (c)(1),
(2) Date: May 3, 2016

(87) PCT Pub. No.: WO2015/093699
PCT Pub. Date: Jun. 25, 2015

(65) Prior Publication Data
US 2016/0282712 A1    Sep. 29, 2016

(30) Foreign Application Priority Data

Dec. 17, 2013  (KR) .................. 10-2013-0157275

(51) Int. Cl.
*G03F 1/22*     (2012.01)
*G03F 1/62*     (2012.01)
*G03F 1/64*     (2012.01)

(52) U.S. Cl.
CPC .................. *G03F 1/64* (2013.01); *G03F 1/22* (2013.01); *G03F 1/62* (2013.01)

(58) Field of Classification Search
CPC .................. G03F 1/22; G03F 1/62; G03F 1/64
USPC ................................................. 430/5
See application file for complete search history.

(56) References Cited

U.S. PATENT DOCUMENTS

| 7,723,704 | B2 | 5/2010 | Wood, II et al. |
| 7,767,985 | B2 | 8/2010 | Okoroanyanwu et al. |
| 8,018,578 | B2 | 9/2011 | Banine et al. |
| 8,535,545 | B2 | 9/2013 | Kim |
| 9,395,630 | B2 * | 7/2016 | Yakunin .......... B82Y 10/00 |
| 9,482,960 | B2 * | 11/2016 | Yakunin .......... B82Y 10/00 |
| 2005/0042524 | A1 | 2/2005 | Bellman |
| 2008/0113491 | A1 | 5/2008 | Wood et al. |
| 2008/0259291 | A1 | 10/2008 | Banine et al. |
| 2013/0088699 | A1 | 4/2013 | Yakunin et al. |
| 2013/0250260 | A1 | 9/2013 | Singh |
| 2014/0160455 | A1 | 6/2014 | Yakunin et al. |
| 2015/0160569 | A1 | 6/2015 | Osorio Oliveros |

FOREIGN PATENT DOCUMENTS

| JP | 2008268956 A | 11/2008 |
| JP | 2015018228 A | 1/2015 |
| KR | 100849714 B1 | 8/2008 |
| KR | 20130088565 A | 8/2013 |
| KR | 20130112737 A | 10/2013 |
| KR | 20130132383 A | 12/2013 |
| KR | 20150021061 A | 2/2015 |
| WO | WO-2008060465 A1 | 5/2008 |

OTHER PUBLICATIONS

International Search Report PCT/ISA/210 for International Application No. PCT/KR2014/004941 dated Aug. 29, 2014.

* cited by examiner

*Primary Examiner* — Christopher G Young
(74) *Attorney, Agent, or Firm* — Harness, Dickey & Pierce, P.L.C.

(57) ABSTRACT

A pellicle film for extreme ultraviolet (EUV) lithography includes a graphite-containing thin film.

7 Claims, 2 Drawing Sheets

PELLICLE FILM INCLUDING GRAPHITE-CONTAINING THIN FILM FOR EXTREME ULTRAVIOLET LITHOGRAPHY

CROSS-REFERENCE TO RELATED APPLICATIONS

This application is a national phase under 35 U.S.C. § 371 of PCT International Application No. PCT/KR2014/004941 which has an International filing date of Jun. 3, 2014,which claims priority to Korean Patent Application No. 10-2013-0157275, filed Dec. 17, 2013, the entire contents of each of which are hereby incorporated by reference.

TECHNICAL FIELD

The inventive concept relates to a pellicle film including a graphite-containing thin film used for extreme ultraviolet lithography.

BACKGROUND ART

When manufacturing a semiconductor device or a liquid crystal display (LCD) panel, photolithography is used for patterning a semiconductor wafer or a substrate for liquid crystal.

In the photolithography, a reticle (referred to as a mask or a masking plate) is used as an original plate for patterning, and a pattern on the reticle is transferred to a semiconductor wafer or an LCD panel. If impurities, such as dust or foreign substances, are adhered to the reticle, light is absorbed in the reticle or reflected from the reticle due to the impurities. Thus, a transferred pattern may be damaged, and accordingly, the performance or yield of a manufactured semiconductor device or LCD panel may be degraded. Accordingly, a pellicle is attached to a surface of a reticle to prevent impurities from adhering to the surface of the reticle.

In this case, even though impurities are adhered to a pellicle formed on the reticle, a light focus is concentrated on patterns of the reticle during lithography, and thus, dust or foreign substances on the pellicle are out of the light focus and thus are not transferred onto the patterns.

The formation of a pattern having a pitch size of 16 nm or less cannot be accomplished by lithography using deep ultraviolet (DUV) light, which is a conventional light source, and needs a light source having a shorter wavelength based on the Rayleigh criterion. Accordingly, lithography using extreme ultraviolet (EUV) light having a relatively short wavelength has drawn attention as the next generation technology with respect to DUV lithography and much research has been performed to develop EUV lithography. However, EUV light having a wavelength of 13.5 nm is considerably absorbed in most materials, and thus, a material that is placed on a path of EUV light in an optical system used in a patterning process is extremely limited, and thus, a material having a very small thickness is required.

A pellicle that has been used for protecting a reticle in a photolithography process is also required in EUV lithography that is still at the research stage, and the development of pellicles is advancing together with the development of an optical system for EUV lithography. Materials, such as Si, Ru, Zr, Mo, and aerogel, have been actively researched as a pellicle film material for EUV lithography.

However, the transmittance of a pellicle with regard to EUV light, which corresponds to a primary condition of a pellicle, is still not satisfied for EUV lithography. To improve the EUV transmittance of a pellicle, a material for the pellicle has to be appropriately selected and the pellicle has to be manufactured to have a very small thickness. However, it is not easy to manufacture a Si, Ru, or Zr film having a very small thickness and maintain its original shape.

In addition, a manufactured pellicle film of a centimeter scale has to have a free-standing ability for the sake of efficient patterning, but a Si, Ru, or Zr film can hardly have a free-standing ability due to a weak tensile strength. Accordingly, researches into a method of supporting a pellicle film by using a mesh formed of Si, Zr, or Ni have been performed (refer to U.S. Pat. No. 8,018,578 B2). However, in this case, due to the mesh, a transmittance of a pellicle film may be reduced and the shape of a projected beam incident thereon may be transformed.

DETAILED DESCRIPTION OF THE INVENTIVE CONCEPT

Technical Problem

The inventive concept provides a pellicle film for EUV lithography, the pellicle film including a graphite-containing thin film and having high EUV transmittance and strong tensile strength.

Additional aspects will be set forth in part in the description which follows and, in part, will be apparent from the description, or may be learned by practice of the presented embodiments.

Technical Solution

According to an aspect of the inventive concept, there is provided a pellicle film for EUV lithography, the pellicle film including a graphite-containing thin film.

Advantageous Effects

According to the inventive concept, a pellicle film has high EUV transmittance and strong tensile strength and a free-standing graphite-containing thin film having a large size may be provided as a new pellicle material.

In addition, the pellicle film according to the inventive concept may be efficiently used in a photolithography process in which a pattern width is about 30 nm or less, about 22 nm or less, or about 16 nm or less.

BEST MODE

Figure 1:
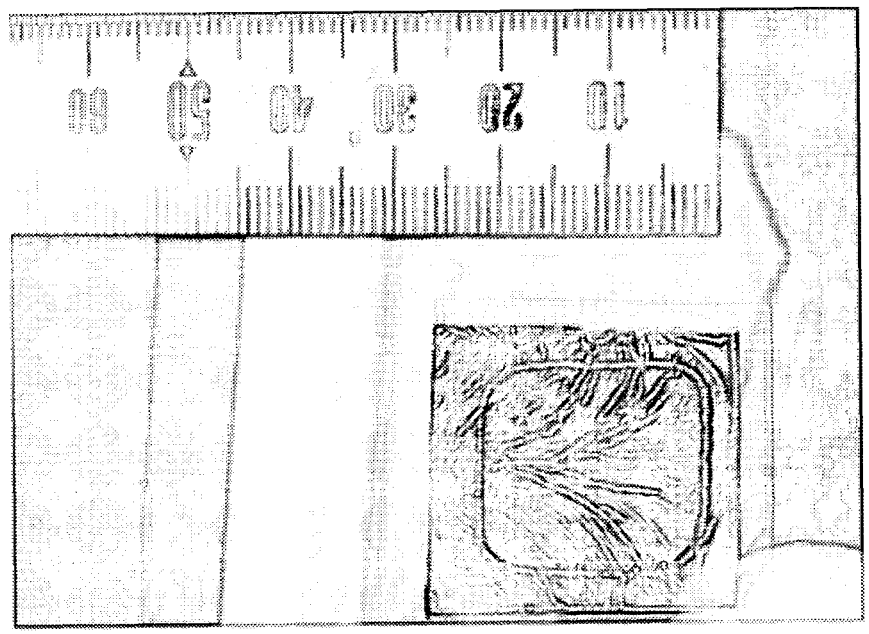
FIG. 1 illustrates an image of a free-standing graphite-containing thin film having a size of 22 mm×22 mm, manufactured according to an exemplary embodiment of the inventive concept.

The inventive concept will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

It will be understood that when an element is referred to as being "connected to" another element, it may be directly connected to the other element or intervening elements may be present.

It will also be understood that when an element is referred to as being "on" another element, it can be directly on the other element, or intervening elements may also be present.

Throughout the specification, when a portion "includes" an element, another element may be further included, rather than excluding the existence of the other element, unless otherwise described.

Throughout the specification, the terms "about" and "substantially" are used to indicate that a manufacturing tolerance or a material tolerance is approximately equal to the disclosed numerical value and also to prevent disclosures, in which an accurate or absolute numerical value is presented to help the understanding of the inventive concept, from being unjustly used by an unscrupulous infringer.

Throughout the specification, the term "combination(s) thereof" included in an expression of a Markush form means a mixture or combination of one or more elements selected from the group consisting of the elements in the expression of the Markush form. Throughout the specification, "A and/or B" means "A or B or A and B".

Hereinafter, exemplary embodiments of the inventive concept are described in detail, but the inventive concept is not limited thereto.

According to an aspect of the inventive concept, there is provided a pellicle film for EUV lithography, the pellicle film including a graphite-containing thin film.

Graphite has a transmittance of about 90% with respect to extreme ultraviolet (EUV) light when the thickness of graphite is about 16.4 nm. In addition, when basal planes of graphite are arranged in the same manner in a planar direction, graphite has a very strong tensile strength in the planar direction. The high EUV transmittance and strong tensile strength of graphite are suitable to manufacture a high quality pellicle film that includes graphite.

In an exemplary embodiment of the inventive concept, the graphite-containing thin film may be a graphite thin film, but is not limited thereto. For example, the graphite-containing thin film may be a graphite thin film including only graphite or may be a thin film having a structure in which one selected from the group consisting of silicon, molybdenum, zirconium, ruthenium, and combinations thereof are stacked or patterned on or under the graphite thin film, but is not limited thereto.

In an exemplary embodiment of the inventive concept, the pellicle film may have a transmittance of about 60% or more with respect to EUV light having a wavelength of 13.5 nm, but is not limited thereto. For example, the pellicle film may have a transmittance of about 60% or more, about 70% or more, about 80% or more, about 90% or more, about 60% to about 100%, about 70% to about 100%, about 80% to about 100%, about 90% to about 100%, about 95% to about 100%, about 60% to about 95%, about 60% to about 90%, about 60% to about 80%, about 60% to about 70%, or about 65% to about 85%, with respect to EUV light having a wavelength of 13.5 nm, but is not limited thereto.

In an exemplary embodiment of the inventive concept, the thickness of the pellicle film may be about 50 nm or less, but is not limited thereto. For example, the thickness of the pellicle film may be about 50 nm or less, about 40 nm or less, about 30 nm or less, about 20 nm or less, about 10 nm or less, about 5 nm or less, about 1 nm to about 50 nm, about 10 nm to about 50 nm, about 20 nm to about 50 nm, about 30 nm to about 50 nm, about 40 nm to about 50 nm, about 1 nm to about 40 nm, about 10 nm to about 40 nm, about 20 nm to about 40 nm, about 30 nm to about 40 nm, or about 3 nm to about 40 nm, but is not limited thereto.

In an exemplary embodiment of the inventive concept, the graphite-containing thin film may be a free-standing nano-scale thin film, but is not limited thereto. The graphite-containing thin film may be manufactured without forming a substrate or may be obtained by removing a substrate after the graphite-containing thin film is formed on the substrate. If the graphite-containing thin film is obtained by removing a substrate after the graphite-containing thin film is formed on the substrate, the removing of the substrate may be performed by a method well known in the art, but is not limited thereto.

For example, a method of manufacturing the graphite-containing thin film may include one selected from the group consisting of chemical vapor deposition, physical vapor deposition, thermal evaporation, sputtering, atomic layer deposition, a spin coating method, a vacuum filtration method, and combinations thereof but is not limited thereto.

In an exemplary embodiment of the inventive concept, the pellicle film may be supported by a square frame having one side of about 5 mm or more or a round frame having a diameter of about 5 mm or more so that the pellicle film is free-standing. However, the inventive concept is not limited thereto. For example, the pellicle film may be a free-standing thin film supported by a square frame or polygonal frame having one side of about 5 mm to about 30 mm. The size of the one side of the square frame or polygonal frame may be about 5 mm to about 30 mm, about 5 mm to about 25 mm, about 5 mm to about 20 mm, about 5 mm to about 15 mm, about 5 mm to about 10 mm, about 10 mm to about 30 mm, about 15 mm to about 30 mm, about 20 mm to about 30 mm, or about 20 mm to about 25 mm, but is not limited thereto. Examples of the polygonal frame may include a triangle, a pentagon, a hexagon, a heptagon, and an octagon, but are not limited thereto. The pellicle film may be a free-standing thin film supported by a round frame having a diameter of about 5 mm to about 30 mm. The diameter may be about 5 mm to about 30 mm, about 5 mm to about 25 mm, about 5 mm to about 20 mm, about 5 mm to about 15 mm, about 5 mm to about 10 mm, about 10 mm to about 30 mm, about 15 mm to about 30 mm, about 20 mm to about 30 mm, about 20 mm to about 30 mm, or about 20 mm to about 25 mm, but is not limited thereto. The pellicle film may have a large size and may be free-standing, but is not limited thereto.

In an exemplary embodiment of the inventive concept, the pellicle film may be used in a photolithography process using an incident beam having a waveform of about 190 nm or less, but is not limited thereto.

In an exemplary embodiment of the inventive concept, the pellicle film may be used in a photolithography process in which a pattern width is about 30 nm or less, but is not limited thereto. The pattern width may be about 30 nm or less, about 22 nm or less, about 16 nm or less, about 1 nm to about 30 nm, about 1 nm to about 25 nm, about 1 nm to about 22 nm, about 1 nm to about 16 nm, about 1 nm to about 10 nm, about 1 nm to about 5 nm, about 5 nm to about 30 nm, about 5 nm to about 25 nm, about 5 nm to about 22 nm, about 5 nm to about 16 nm, about 5 nm to about 10 nm, about 10 nm to about 30 nm, about 10 nm to about 22 nm, about 10 nm to about 16 nm, about 16 nm to about 30 nm, about 16 nm to about 25 nm, about 16 nm to about 22 nm, about 22 nm to about 30 nm, about 22 nm to about 25 nm, or about 25 nm to about 30 nm, but is not limited thereto.

Mode of the Inventive Concept

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that will be thorough and complete, and will fully convey the concept of the inventive concept to those skilled in the art.

[Embodiments]

First Embodiment: Manufacture of a Pellicle Film Including a Graphite-Containing Thin Film (5 mm Free-Standing)

A nickel foil having a thickness of 25 μm was placed in a heating container and was heat-treated for a 30 minutes in an atmosphere including hydrogen at a temperature of 1,035° C. Next, the heat-treated nickel foil was heat-treated for 90 minutes in an atmosphere including hydrogen and methane at a temperature of 1,035° C. After cooling the heat-treated nickel foil at room temperature, a graphite thin film grown on the surface of the nickel foil was obtained. To separate the graphite thin film from the nickel foil, a method of etching the nickel foil by using an aqueous solution including iron (III) chloride was used. In addition to such a method, a method of separating the graphite thin film from the nickel foil by using a cericammonium nitrate aqueous solution may be used. The graphite thin film separated from the nickel foil was taken up out of the aqueous solution, impurities, such as nickel, cerium, and iron, were removed from the graphite film by using a hydrochloric acid solution and water, and then the graphite film was placed on a round frame having a diameter of 5 mm to form a 5 mm free-standing pellicle film.

Second Embodiment: Manufacture of a Free-Standing Pellicle Film Having a Size of 22 mm A nickel foil having a thickness of 25 μm was placed in a heating container and was heat-treated for a 30 minutes in an atmosphere including hydrogen at a temperature of 1,035° C. Next, the heat-treated nickel foil was heat-treated for 90 minutes in an atmosphere including hydrogen and methane at a temperature of 1,035° C. After cooling the heat-treated nickel foil at room temperature, a graphite thin film grown on the surface of the nickel foil was obtained. To separate the graphite thin film from the nickel foil, a method of etching the nickel foil by using an aqueous solution including iron (III) chloride was used. In addition to such a method, a method of separating the graphite thin film from the nickel foil by using a cericammonium nitrate aqueous solution may be used. The graphite thin film separated from the nickel foil was taken up out of the aqueous solution, impurities, such as nickel, cerium, and iron, were removed from the graphite film by using a hydrochloric acid solution and water, and then the graphite film was placed on a square frame having a size of 22 mm×22 mm to form a free-standing pellicle film having a size of 22 mm.

FIG. 1 illustrates an image of a free-standing graphite-containing thin film having a size of 22 mm×22 mm, manufactured according to the current embodiment of the inventive concept. As shown in FIG. 1, a large-area free-standing pellicle film having a size of 22 mm×22 mm was manufactured.

First Experimental Example: Measurement of Transmittance

To check the EUV transmittance of the pellicle film manufactured in the first embodiment, the transmittance of the pellicle film was measured by using an analyzer (a model name: EUVOTM40 manufactured by FST Inc.).

As a result, the pellicle film manufactured in the first embodiment had a transmittance of about 65% with respect to EUV light having a wavelength of 13.5 nm.

Second Experimental Example: Measurement by Raman Spectroscopy

A Raman spectroscopic analyzer (a model name: alpha300R manufactured by WITec) having an incident laser wavelength of 532 nm was used to check the crystallinity of the pellicle film manufactured in the first embodiment. The measurement results are shown in FIG. 2.

Figure 2:
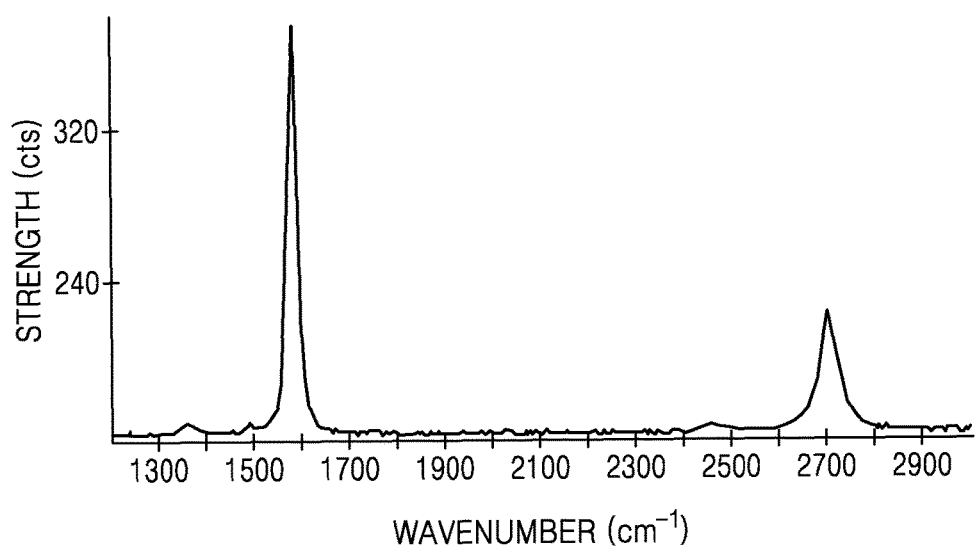
FIG. 2 illustrates a Raman spectrum graph showing the crystallinity of a graphite-containing thin film manufactured according to an exemplary embodiment of the inventive concept.

FIG. 2 illustrates a Raman spectrum graph of the crystallinity of a graphite-containing thin film manufactured according to an exemplary embodiment. As shown in FIG. 2, a low D-band (about 1,350/cm), a sharp G-band (about 1,580/cm), and a 2D-band (about 2,700/cm) were identified, which means that the graphite-containing thin film according to the current embodiment had high crystallinity.

Third Experimental Example: Calculation of Centripetal Acceleration

The centripetal acceleration that a specimen (e.g., the free-standing pellicle film obtained in the first embodiment) receives during a uniform circular motion was calculated to check a strength of the specimen to an acceleration change. The centripetal acceleration was calculated by using a spin coater and using a revolutions per minute (RPM) speed of the spin coater and a distance from the center of a chuck for fixing a sample to the specimen.

As an experimental result, the pellicle film including the graphite-containing thin film according to the current embodiment withstood an in-plane acceleration of 200 m/s2.

Fourth Experimental Example: Measurement of Pressure Change

To check a strength to a pressure change of the pellicle film manufactured in the first embodiment, a pressure change speed was measured while changing a pressure after loading a specimen (e.g., the free-standing pellicle film obtained in the first embodiment) in a chamber. A baratron gauge manufactured by MKS Inc. was used for measuring the pressure change speed.

As an experimental result, the pellicle film including the graphite-containing thin film according to the current embodiment withstood a pressure change of 17 mbar/s.

When reviewing the aforementioned experimental results, the pellicle film including the graphite-containing thin film according to the current embodiment has excellent transmittance with respect to EUV light having a wavelength of 13.5 nm and a strong tensile strength. Accordingly, the graphite-containing thin film provides excellent characteristics when used as a pellicle film and thus may be applied to photolithography.

While this inventive concept has been particularly shown and described with reference to exemplary embodiments thereof, it will be understood by those skilled in the art that various changes in form and details may be made therein without departing from the spirit and scope of the inventive concept as defined by the appended claims.

The exemplary embodiments should be considered in descriptive sense only and not for purposes of limitation. Therefore, the scope of the inventive concept is defined not by the detailed description of the inventive concept but by the appended claims, and all differences within the scope will be construed as being included in the present inventive concept.

The invention claimed is:

1. A pellicle film for extreme ultraviolet (EUV) lithography, the pellicle film comprising a graphite-containing thin film,
   wherein the graphite-containing thin film comprises a graphite thin film.

2. The pellicle film of claim 1, wherein the pellicle film has a transmittance of 60% or more with respect to EUV light having a wavelength of 13.5 nm.

3. The pellicle film of claim 1, wherein a thickness of the pellicle film is 50 nm or less.

4. The pellicle film of claim 1, wherein the graphite-containing thin film is a free-standing nano-thin film.

5. The pellicle film of claim 1, wherein the pellicle film is used in photolithography using an incident beam having a wavelength of 190 nm or less.

6. The pellicle film of claim 1, wherein the pellicle film is supported by a square frame having one side of 5 mm or more so that the pellicle film is free-standing.

7. The pellicle film of claim 1, wherein the pellicle film is supported by a round frame having a diameter of 5 mm or more so that the pellicle film is free-standing.

* * * * *